United States Patent [19]

Bullock

[11] Patent Number: 5,066,904
[45] Date of Patent: Nov. 19, 1991

[54] COAXIAL CURRENT SENSORS

[75] Inventor: Donald F. Bullock, Madbury, N.H.

[73] Assignee: General Electric Company, Somersworth, N.H.

[21] Appl. No.: 399,344

[22] Filed: Aug. 28, 1989

Related U.S. Application Data

[63] Continuation of Ser. No. 259,234, Oct. 18, 1988, abandoned.

[51] Int. Cl.[5] .............................................. G01R 1/20
[52] U.S. Cl. .................................... 324/127; 324/126; 336/82; 323/357
[58] Field of Search .................. 324/117, 127, 126; 323/357; 338/49; 336/181, 223, 174, 175, 82

[56]          References Cited
          U.S. PATENT DOCUMENTS

| | | | |
|---|---|---|---|
| 4,182,982 | 1/1980 | Wolf et al. | 324/127 |
| 4,362,990 | 12/1982 | Schneider et al. | 324/117 R |
| 4,492,919 | 1/1985 | Milkovic | 324/127 |
| 4,496,932 | 1/1985 | Halder | 338/49 |
| 4,513,273 | 4/1985 | Friedl | 336/55 |
| 4,559,495 | 12/1985 | Lienhard | 324/117 R |
| 4,616,174 | 10/1986 | Jorgensen | 324/117 R |
| 4,616,176 | 10/1986 | Mercure et al. | 324/127 |
| 4,700,131 | 10/1987 | Miller | 324/117 H |
| 4,749,940 | 6/1988 | Bullock | 324/127 |
| 4,761,605 | 8/1988 | Jochum | 324/142 |

Primary Examiner—Reinhard J. Eisenzopf
Assistant Examiner—Edward Urban
Attorney, Agent, or Firm—Robert E. Brunson

[57]          ABSTRACT

A sensor for measuring large magnitudes of A.C. current utilizes a current divider having parallel conductors and a current comparator coupled to one of the conductors so arranged as to perform first and second stages of scaling of the A.C. current to obtain an output signal from the sensor proportional to the A.C. current. The overall sensor ratio is the product of the ratios of the first and second stages, thereby permitting very large ratios to be obtained. Components of the sensor are arranged so as to cause cancellation of magnetic fields by the sensor and to make the sensor immune from incident magnetic fields.

48 Claims, 5 Drawing Sheets

COAXIAL CURRENT SENSORS

This is a continuation of copending application Ser. No. 07/259,234 filed on Oct. 18, 1988, now abandoned.

BACKGROUND OF THE INVENTION

1. Field of the Invention

The present invention relates to apparatus for sensing power line voltage and current components of alternating current electric energy, and more particularly to novel sensors for sensing line currents and scaling such currents to produce corresponding analog output signals proportional to the line currents while compensating for thermal and magnetic field effects and minimizing phase errors between the sensed line currents and the analog output signals.

2. Description of the Prior Art

Many electrical and electronic devices such as, for example, induction and electronic type watthour meters for metering electric power and energy usage, require means for sensing line current components flowing in a conductor, and producing an output signal which is accurately proportional, over a large range of magnitudes, to the line current.

Induction type watthour metering devices for alternating current electrical energy measurement have been provided by producers for years, and have been used almost exclusively for measuring energy consumption by separate electrical energy users. Typically, watthour meters are used for indicating consumption in kilowatt hours. Induction type watthour meters typically have voltage and current coils and a rotating disc driven by fluxes from the two coils.

The current sensing circuit of a conventional induction watthour meter senses the current to be measured in a very direct manner. This sensing is done by wrapping the line current carrying conductor around an iron core to form a current coil to create a magnetic flux in the core which is used, in conjunction with flux from the voltage coil, to rotate the above mentioned disc at a rate proportional to electrical energy consumption. Current coil designs have been made using as many as 640 ampere turns around the core and which are capable of carrying up to 320 amperes.

Generally, if the magnitude of the line current to be measured is in excess of the above mentioned 320 amperes, or alternatively if the line conductor is at some high voltage potential with respect to ground, it is common practice, and frequently required, to interpose a current transformer between the watthour meter and the line conductor or current carrying circuit being metered. Such current transformers are usually rated at a nominal current in the secondary winding of 5 amperes, however, in many instances up to 20 amperes of secondary current may be used without exceeding the thermal rating of the transformer. A meter which is used to serve the above requirement is commonly referred to as a "transformer rated" watthour meter and typically has a maximum current coil rating of 20 amperes.

Large currents and voltages of the above type are suitable for induction type watthour meters. However, such large currents and voltages cannot be used in the design of a fully electronic watthour meter which uses electronic or integrated circuits for measurement and which are designed to operate at small signal levels many magnitudes below the line currents and voltages.

The voltage and current inputs to the types of integrated circuits referred to are typically less than 5 volts or 5 milliamperes. Therefore, it is generally required that the sensors providing voltage and current responsive analog signals to the measuring circuits have large transformation ratios. In the case of current sensors, their output signals must be linear over a wide range in the magnitudes of the line current supplied to the sensors.

At a typical power utility customer location, sixty Hertz AC electric power is delivered at substantially constant line voltages in the range of 120-480 volts defining the line voltage components of the electric energy quantity to be measured.

On the other hand, line current which defines the current component of the electric energy to be measured, varies considerably. Typically, this variation is in a desired linear measurement range from one-half ampere to two hundred amperes or in a current range of approximately one to four hundred. Accordingly, conventional voltage transformer arrangements often can provide practical voltage sensing devices. However, current transformers receiving the aforementioned wide input variations and producing the required low level signal outputs often require structural arrangements which contribute to a substantial size and consequent increase in cost. It is well known by designers of such current transformers that the ampere turns of the primary and of the secondary must be equal. In addition, since maximum primary current levels may reach two hundred or more amperes, the primary and secondary winding sizes become large in order to produce the low level output signals required by the electronic measuring circuits. In view of the foregoing, it can be seen that a need exists for a current sensing apparatus for scaling a large range of currents (e.g. 20 to 200 amperes or more) to a suitable voltage and current level (e.g. 1-5 volts or 1-5 milliamperes) for input to the above measuring circuits. Such scaling necessitates a large scaling ratio of 100,000:1 or more. In addition, if adequate metering accuracy is to be achieved, the magnitude and the phase angle of an output signal from the sensing apparatus must be very accurate with respect to the magnitude and phase of the line current being applied to the apparatus. Furthermore, the sensing apparatus must be physically small enough to fit within the physical design constraints, or envelope restrictions, of a conventional induction type watthour meter in order to comply with industry standards and to permit direct interchange of an electronic meter in place of an induction meter.

In addition to the foregoing needs, the sensing apparatus must provide isolation between its output signal point and its point of connection to the line current conductor, which may be operating at high current levels and at voltage levels of 480 volts rms or above. Such isolation also dictates that high voltage transients on the line current conductor be suppressed to prevent such transients from getting through the sensing apparatus and affecting the output signal therefrom.

Another problem which arises in current sensors which use current coils or transformers is saturation of the magnetic core caused by substantially any d.c. component superimposed on the waveform of the a.c. current flowing in the line conductor. It is well known by meter designers that a small d.c. component may be present on the line conductor as a result of incidental half wave rectification caused by various electrical apparatus connected to the line conductor. Persons intent on committing meter fraud have also been found to deliberately insert much larger d.c. components on the line conductor to significantly affect the metering accuracy of the current sensor. As such, a need also exists for a current sensor design which cannot be compromised by the presence of any d.c. component on the line conductor.

Current sensors are also known to generate an external magnetic field, and to also be affected by incident magnetic fields from other sources (including adjacent current sensors such as are employed in polyphase watthour meters). Thus, a further need exists for a current sensor design which generates only a minimum external magnetic field and one which is essentially unaffected by incident magnetic fields from other sources. Such a current sensor is highly desireable in a watthour meter where multiple current sensors are operated in close proximity.

Many prior art current sensor and transducer designs are known using various techniques, attempting to fulfill and solve the above needs and problems such as disclosed in U.S. Pat. Nos. 4,182,982; 4,492,919; 4,496,932; 4,513,273; 4,616,174; and 4,749,940. U.S. Pat. Nos. 4,492,919 and 4,749,940 are assigned to the assignee of the present invention.

In attempts to solve the above mentioned problems and needs, the prior art contains several approaches for dividing a load current into two current paths to produce a sample current or voltage proportional to the load current.

Typical current divider techniques are disclosed in U.S. Pat. Nos. 4,182,982 and 4,492,919, wherein a current in a line conductor is split, or divided, into a main shunt path and a parallel auxiliary path. The auxiliary path contains a much smaller cross section than does the main shunt path and current through the divider path combination divides in substantially the ratio of the cross sections. A toroidal magnetic core with a winding of many turns is disposed about the auxiliary path. The auxiliary path thus forms a one-turn primary and the many turns about the toroidal core form a secondary winding. A current through the secondary is proportional to the current in the primary divided by the number of turns in the secondary. The techniques disclosed in these patents have several disadvantages. They use copper and thus suffer from reduced accuracy due to the substantial thermal coefficient of resistance of copper which may cause the resistance to change as much as 30 percent over the environmental temperature range to which watthour meters are exposed. In addition, it is difficult to obtain a sufficient current division to give the many orders of magnitude reduction (scaling) in output current or voltage compared to load current. Finally, these techniques are subject to output signal errors resulting from incidental magnetic fluxes surrounding the current divider and coil combination.

A further technique, disclosed in U.S. Pat. No. 4,496,932, employs two slits in a substantially flat and longitudinal conductor to accommodate a measurement conductor which is inserted between a pair of shunt conductors connected in parallel with the measurement conductor. The measurement conductor is deflected, first in one direction, and then in the other, to provide an opening or space for the passage of a one turn loop of magnetic core material between the shunt conductors and the measurement conductor. In one embodiment, the shunts and the measurement conductor are folded into a U-shape to align holes in each leg of the U. The one-turn of the loop of magnetic material is then passed through the aligned holes for receiving a sample of current produced by the presence of the slits and the measurement conductor when current is passed through the shunt conductors and the measurement conductor. A secondary winding of many turns on the core loop serves to provide an output signal. This device suffers from the presence of strong magnetic fields in its vicinity which are capable of saturating the core and thus introducing errors in the output signal or cancelling the output. In addition, no provision is provided for cancelling the effects of non-uniform magnetic fields originating external to the measurement device, as are routinely experienced in watthour meters.

In addition to the foregoing set out disadvantages, prior art current sensors, and their attendant current dividers, of the type disclosed in the above patents have been found to suffer from two other principal disadvantages; namely (1) non linearity, and (2) phase shift between the input current and the output current or voltage from the sensor. The cause of items (1) and (2) are explained as follows:

(1) Non Linearity

The non linearity arises from variations in the resistance of various sections of the current divider which thereby affect the ratio of the two resistances forming the divider. Since the dividers have been designed to carry large currents in the order of hundreds of amperes, the examples noted in the above described patents have been constructed in copper to minimize self-heating due to $I^2R$ losses. Copper has a very high temperature coefficient of resistance, being about 0.4% per 1° C. temperature change. It has therefore been necessary to adopt elaborate construction methods in an effort to achieve an isothermal condition for the whole body of the current divider.

In spite of these efforts the $I^2R$ losses, ambient temperature changes and solar heating inevitably create a heat flow in the divider which create small temperature differences between the various parts of the divider and as a consequence measurement errors occur.

(2) Phase Shift

The phase error arises from the magnetic coupling that exists between the parallel conductors in circuits that typically form a current divider. The shunt circuit that carries the majority of the current has an associated magnetic field surrounding it, giving rise to self-inductance in the shunt circuit. This magnetic field also links with the parallel circuit that carries the measurement current, giving rise to mutual inductance between the two circuits. These inductances cause the divider to change from a simple resistance divider to a complex impedance divider with associated phase shifts dependent on the inductances. The complex geometry of the divider and its parallel conductor construction, together with the complex magnetic field distribution, prohibit any possibility of computing or predicting the above mentioned inductances and consequently the design of these current dividers has been largely an empirical process.

In view of the foregoing, it can be seen that a further need exists for a current sensor and current divider structure which lends itself to a calculable design approach rather than using an empirical approach. A copending patent application, Ser. No. 944,021, filed on Dec. 22, 1986 (assigned to the assignee of the present invention) discloses a current divider (or shunt) comprised largely of materials having very small temperature coefficients of resistance in the order of 20 parts per million per one degree centigrade. This is less than the temperature coefficient of copper by a factor of about 200. These materials also have bulk resistivities from about 25 to 80 times higher than copper. This application discloses design approaches and techniques using these materials in current sensors without any increase in the $I^2R$ losses in the sensor when compared to the current coil of the type used in an induction type watthour meter. For a teaching of these design approaches and the characteristics of those materials the above application Ser. No. 944,021 is incorporated here by reference.

BRIEF SUMMARY OF THE INVENTION

In accordance with the invention, a current sensor for sensing the magnitude of an AC current flowing therethrough, includes a current divider having a pair of parallel connected, coaxially disposed, current-carrying elements having resistances $R_1$ and $R_2$ for carrying components of the AC current, and a current comparator, coaxially communicatively coupled to a one of the pair of current-carrying elements, whereby the one of the pair of current-carrying elements performs a first stage of scaling of the AC current, and the current comparator, in response to the current flowing in the one current carrying element, performs a second stage of scaling of the AC current to generate an output signal having a magnitude proportional to the AC current flowing through the current sensor and wherein the overall current sensor ratio is the product of the ratios of the scaling values of the first and second stages.

In a preferred embodiment, the current divider is constructed largely from conductive materials having very low temperature coefficients of resistance to minimize variation of the current sensor ratio with temperature, while the coaxial design of the current divider minimizes the phase error between the input current to the sensor and the scaled output signal from the current comparator.

In presently preferred embodiments, the one of the pair of current carrying elements, which is coupled to the current comparator, has a greater resistance than the resistance of the other current carrying element to thereby establish the magnitude of the scaling of the first stage. Also, the current comparator may be a compensated current transformer having first and second secondary windings would on a magnetic core, and the one of the pair of current carrying elements serves as a primary winding for the current transformer.

An amplifier, responsive to an output of the first secondary winding, may be employed to provide a control or compensating signal or current, to the second secondary winding to produce a flux in the core of the transformer to thereby reduce the flux in the core toward zero by balancing the ampere turns resulting from the current flowing in the primary winding and thus provide a second scaled output from the second secondary winding which is proportional to the AC current flowing through the current divider.

The invention also provides a current sensor and current divider structure which lends itself to a readily calculable design having predictable results not readily heretofore attainable by the use of empirical design approaches.

Accordingly, it is an object of the present invention to provide a current sensor having enhanced operating characteristics.

It is another object of the present invention to provide a current sensor constructed of materials having very low temperatures of coefficient of resistance and which minimizes variation of the current sensor input output ratio with temperature variations in parts of the sensor.

It is a further object of the present invention to provide a current sensor of a coaxial design, which performs multi-stage scaling of input current to the sensor and which permits very large ratios to be obtained and which minimizes the phase error between the input current and scaled output of the sensor.

It is still a further object of the present invention to provide a current sensor design, having a current comparator transformer, which is substantially immune to core saturation normally caused by d.c. components which are superimposed on the AC current provided to the sensor.

These and other objects of the present invention will become apparent upon consideration of the following detailed description, when read in conjunction with the drawings.

BRIEF DESCRIPTION OF THE DRAWING

FIG. 9b is a diagram of a control circuit suitable for controlling the switches in the circuit of FIG. 9a.

FIG. 9c is a representation of the waveforms at various places in the circuit of FIG. 9a.

DETAILED DESCRIPTION OF THE INVENTION

Prior to proceeding with a detailed description of the invention, and to better appreciate its contribution to the art of current sensors, it is first believed advantageous to provide a basic operational description of the invention and the various design considerations to be taken into account in designing current sensors having the novel characteristics afforded by the present invention.

Figure 1:
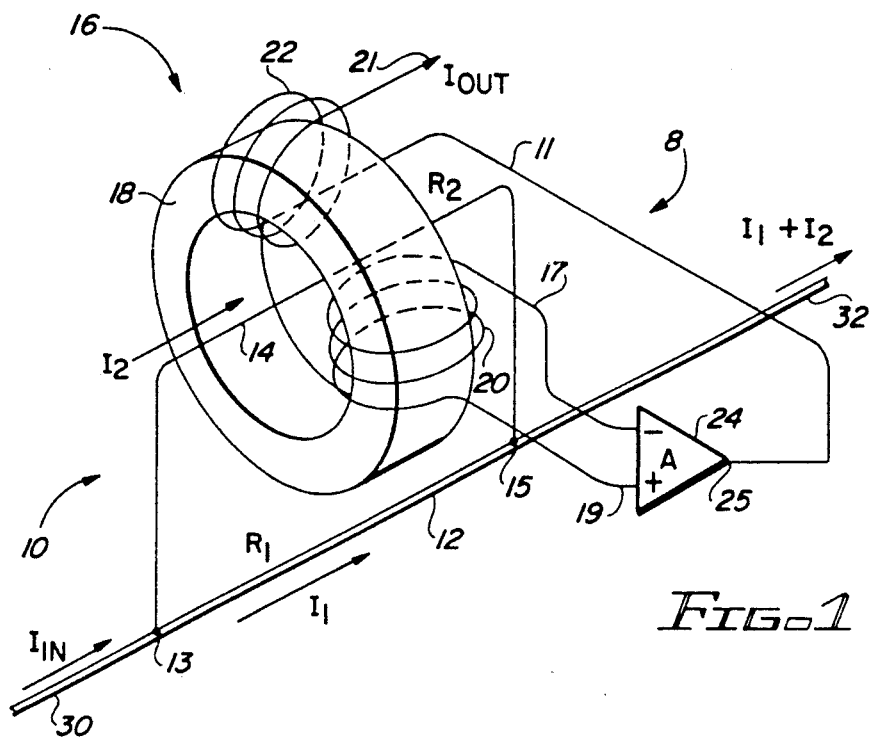
FIG. 1 is a simplified electrical schematic of a current sensor in accordance with the invention and which is useful in understanding the operation thereof.

Now, in context of the above, reference is first made to FIG. 1 which schematically illustrates a Current Sensor 8 useful in understanding the basic design and operational principles of the invention. The Sensor 8 is comprised of a Current Divider, shown generally at 10, which includes a first current carrying element, shown as a Shunt Resistor 12 having a value $R_1$, and a second current-carrying element, shown as a Measuring Resistor 14 having a value $R_2$. As shown in FIG. 1, Resistors 12 and 14 are connected in parallel at 13 and 15.

The Current Sensor 8 is designed to be connected in series with a current source (not shown) whereby an input current X$I_{in}$X in a Conductor 30 flows through the Sensor, via Resistors 12 and 14, and out of the Sensor in a Conductor 32 as total current $I_1+I_2$.

The current, $I_{in}$, to be measured divides into a current $I_1$, in Shunt Resistor 12 and a current, $I_2$, in Measuring Resistor 14. The current $I_2$, in Measuring Resistor 14 provides a first stage of scaling of the input current, $I_{in}$, and that current is given by:

$$I_2 = \frac{I_{in}}{K} \quad (1)$$

$$\text{where } K = \left[\frac{R_2}{R_1} + 1\right]$$

A Current Comparator, shown generally at 16, provides a second stage of scaling of the input current, $I_{in}$, by sensing the current $I_2$ flowing in Resistor 14 and providing a fully scaled output current or signal, $I_{out}$, having a magnitude proportional to the input current, $I_{in}$, but many magnitudes lower than $I_{in}$.

The Current Comparator 16 includes a Core 18 of magnetic material and First and Second Secondary Windings 20 and 22. Windings 20 and 22 each consist of a large number of turns of fine gage wire evenly distributed around the Core 18. It should be noted that Core 18 encircles Resistor 14, whereby Resistor 14 serves as a single turn primary winding for the Current Comparator 16.

The operating principles of the Current Comparator 16 are relatively straight forward and are well known in the art. It is well known that an alternating magnetic flux field surrounds any current-carrying conductor when an alternating current is passed through the conductor. In the Comparator 16 an alternating magnetic flux from Resistor 14 is induced in the Core 18. Secondary Winding 20 on Core 18 is used to sense the presence of this alternating flux in the core. This sensing results in a voltage being induced in the Winding 20 to provide an input signal, via Conductors 17 and 19, to negative (−) and positive (+) input terminals of a high gain differential Amplifier 24.

An Output Terminal 25 of Amplifier 24 is connected at 11 to one end of compensation or feedback Winding 22. The output signal from Amplifier 24 causes a current to flow in Winding 22 as an output signal, $I_{out}$, of the Comparator 16 at an output terminal 21. The direction of current flow through Winding 22 is such as to induce a compensating flux from Winding 22 into Core 18 to reduce the alternating flux in the core toward zero. Comparator and Amplifier arrangement operates, dynamically, to keep the alternating magnetic flux in Core 18 at a very low value approaching zero. As a result, the magnetizing ampere turns resulting from the measured or sensed current, $I_2$, in the single turn primary winding (formed by Resistor 14) of the Transformer 18 are balanced by the magnetizing ampere turns resulting from the current Iout flowing in the N-Turn Secondary Winding 22. Since the transformer ampere turns are equal, or balanced, then;

$$N \times Iout = I_2 \times 1 \quad (2)$$

$$Iout = \frac{I_2}{N} \quad (2a)$$

Substituting from Equation (1) yields:

$$Iout = \frac{I_{in}}{K \times N} \quad (3)$$

The output signal, Iout, of the Current Sensor is, thus shown, to be a scaled version of the input alternating current, $I_{in}$, where the final scaling factor is the product of two independent scale factors determined by a ratio of resistances (K) and a number of turns N in the output of Secondary Winding 22. Thus, it can be seen that a designer is able to select the independent scale factors to best satisfy the limitations of the Current Sensor while meeting the requirement for overall scale factor.

To develop an appreciation and understanding of the complexities and difficulties in developing a highly accurate current sensor as contemplated by the present invention, the following several practical considerations, understandings, findings and limitations, have been considered and at least some of which have lead to the preferred embodiments:

(1) Current Sensor Size

For the Current Sensor 8 to fit within the small physical constraints of an electronic watthour meter, and meet industrial installation and meter inter-change requirements, the sensor must be constructed of materials which lend themselves to making a small package that will fit within the above constraints.

(2) Current Divider Resistance

The Current Divider must be capable of carrying input or load current, $I_{in}$ without excessive heating or power loss. In the previously described prior art patents, these requirements led to the use of copper conductors for the parallel resistors which make up the divider.

Unfortunately, copper has a large temperature coefficient of resistance. Even a temperature difference of a fraction of 1° C. between the parallel resistors of a divider will result in an unacceptable change in the ratio factor K in equation (1). Such temperature difference can easily result from resistive heating, solar radiation and other influences. While copper may be used where accuracy is unimportant, it does not lend itself to current divider structures requiring high accuracy. As previously mentioned, certain metal alloys have been developed specifically to have low temperature coefficient of resistance, typically of the order of 20 parts per million per degree centigrade. These materials are sold under trademarks such as ADVANCE, KARMA, CU-PROTHAL 294, NIKROTHALLX and COPEL. All these alloys, in addition to low temperature coefficient, have high resistivity and are expensive. It has been found that these materials are ideally suited for use in small current sensors of the type contemplated by the present invention. However, if these materials are to be used in the current divider, it is necessary to use a large cross section to carry the current and a small length in order to keep the power dissipation small and the material usage to a minimum. Since the resistance alloy has to be joined to copper terminal conductors (or other conductive materials) care should be taken in designing these joints to ensure that no significant amount of copper conductor (or other material) is re-introduced into the divider current paths which will degrade the low temperature coefficient of the alloy.

(3) Current Divider Inductance

Any current carrying conductor (including Resistors 12 and 14) has associated with it a magnetic field. The interaction of the currents and magnetic fields result in self and mutual inductances which change the simple resistors of FIG. 1 into more complex impedances when the Current Sensor is used to measure A.C. currents. It is desirable to be able to calculate and control these inductances when designing the current divider rather than using an empirical approach.

(4) D.C. Current Component

Any d.c. component in the load current, $I_{in}$, will also be present in current $I_2$ in Measuring Resistor 14, reduced by the divider ratio K as in equation (1). This current must not be great enough to saturate the Magnetic Core 18 of the Current Comparator 16. It has been found that, by using a ferrite material and suitable path length (ie. the mean or effective circumference) for Magnetic Core 18, a d.c. component of about 2 amperes can be sustained in $I_2$ flowing in Resistor 14 without seriously degrading the permeability of Magnetic Core 18. The d.c. component of $I_{in}$ can thus be about "2K" amperes without significant loss of measuring accuracy.

(5) Amplifier Stability

The Current Comparator 16 as shown in FIG. 1 operates with Amplifier 24 in a closed loop feed back mode as far as A.C. currents are concerned. This is because such currents will be coupled from the Amplifier's output back to its inputs via the mutual inductance between Windings 20 and 22 on Magnetic Core 18. The Amplifier 24 has a small d.c. offset voltage present at its input terminals which, in the circuit as shown, would be amplified by the very large open loop gain of the Amplifier and result in complete saturation of its output. Therefore, as will subsequently be described, it is necessary to modify this simple circuit to provide d.c. feedback and stable operation.

Figure 3:
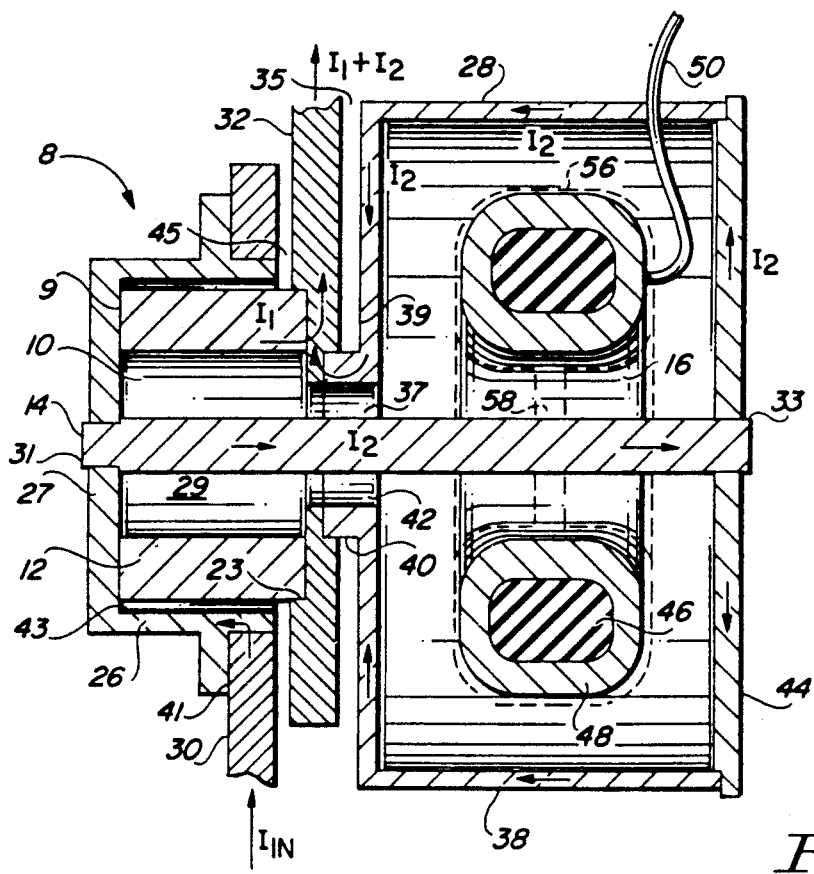
FIG. 3 is a sectioned view of the current sensor of FIG. 2.
Figure 2:
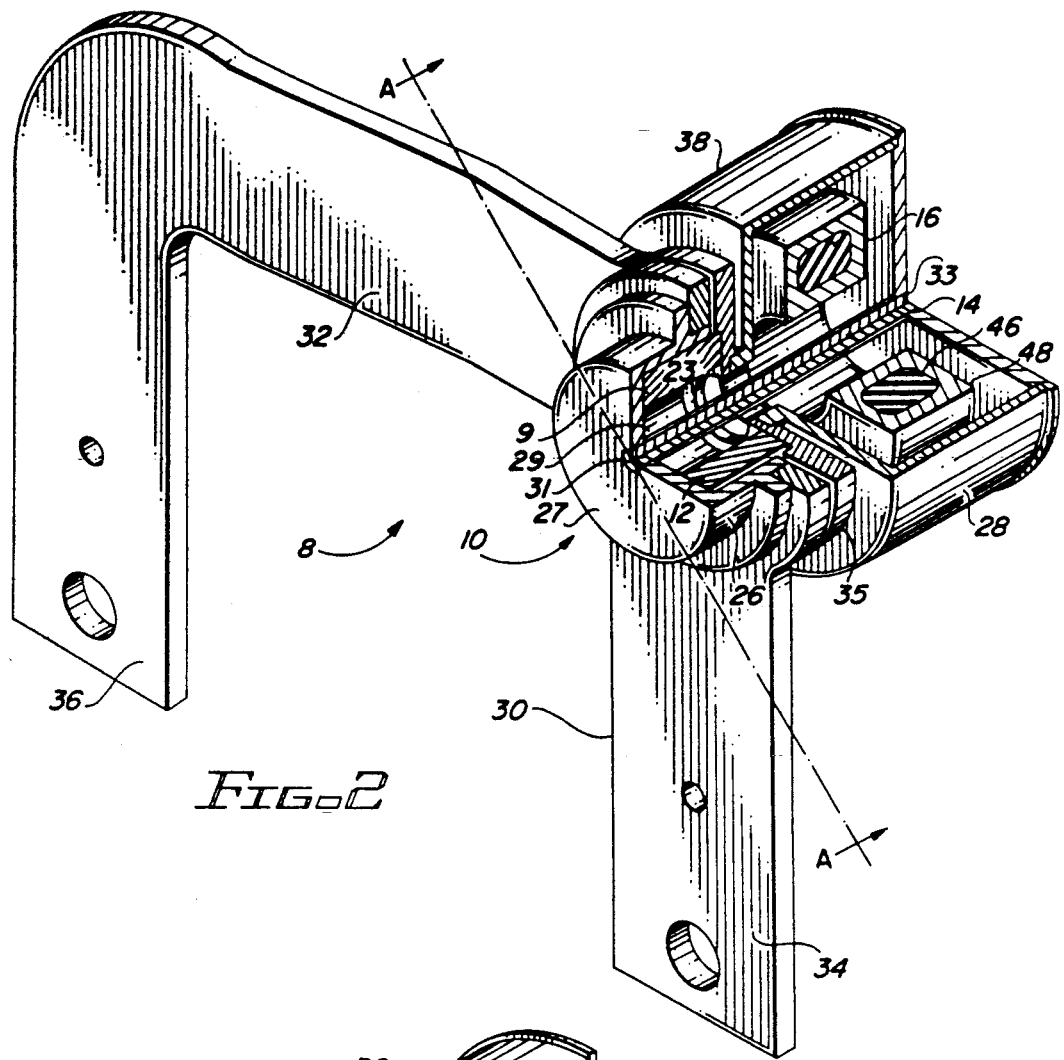
FIG. 2 is an isometric view of a first embodiment of the novel current sensor in accordance with the principles of the invention and which illustrates current connections adapting the sensor for use in an electronic watthour meter.

Reference is now made to FIGS. 2 and 3 which show embodiments of the invention, wherein the Current Sensor 8 is constructed for use in an electronic watthour meter having a conventional meter base which is adapted to plug the meter into a conventional meter socket. The meter base and socket are not shown in the figures, however, it is understood that two Current Conductors 30 and 32, shown as blades 34 and 36, (in FIG. 2) normally protrude from the meter base and are plugged into the meter socket, to connect the Sensor 8 in series with a line conductor carrying the current to be sensed.

The Current Divider 10 of Sensor 8 is constructed of a cylindrical Conductive Housing, shown generally at 35, comprising two cylindrical Cup Shaped Conductive Members 26 and 28 which are joined together to form the Housing 35. Conductor 30 may form an integral part of Member 26 and Conductor 32 may form an integral part of Member 28. Preferably, the Conductive Housing 35, including Members 26 and 28 and Conductors 30 and 32, are of copper construction. However, other suitable conductive materials, such as aluminum, may be used. Further, while the embodiments are shown to be of a cylindrical construction and shape, it is understood that rectangular or other suitable shapes may be constructed.

The Shunt Resistor 12 is of a cylindrical construction and has an Aperture 29 extending lengthwise therethrough. It should be noted that Resistor 12 is of a larger cross section than Resistor 14 and thus is of a much lower resistance than Resistor 14. Resistor 12 is mounted within the Member 26 and is electrically isolated therefrom, except at its point of circumferential attachment of a first end at 9 to a Face or Bottom 27 of the Cup-Shaped Member 26. The other end of Resistor 12 is similarly attached at its other end at 23 to the open end of Member 28.

The Measuring Resistor 14 is shown as an elongated cylindrical rod disposed within the Aperture 29 of Resistor 12 and the hollow portion of Member 28. Member 28 has an Aperture 37 in its open end for receiving Resistor 14. Resistor 14 is electrically bonded, at opposite ends thereof at connections 31 and 33, to the Bottom 27 of Member 26 and to a Face or Bottom 44 of Member 28. Except for these points of connection, Resistor 14 is electrically isolated from the rest of the Current Divider 10.

Reference is now made specifically to FIG. 3, which is a cross-section view of the Sensor 8 taken along plane A—A in FIG. 2. FIG. 3 more clearly shows the connection or bonding details of the various parts of the Sensor. Member 28, at its open end, has a Neck 40 which contains the Aperture 37. The Conductor 32 has a Clearance Hole 42 through which the Resistor 14 passes. As can be seen, the Conductor 32 is attached on opposite faces thereof at 39 and 23 to the Member 28 and the Shunt Resistor 12, thus, bonding the Shunt Resistor 12, the Measurement Resistor 14 and the Conductive Cup-Shaped Member 28 into a current divider of unitary construction.

The construction of the Member 26 and its bonded Conductor 30 is also best shown in FIG. 3. The Conductor 30 is bonded at the circumference of Member 26 as shown by the connection made at a Shoulder 41 on Member 26.

The Current Comparator 16 is shown mounted within the Cup-Shaped Member 28 and is communicatively coupled to Resistor 14 to provide an output Signal Iout (FIG. 1) proportional to the input Current, $I_{in}$. Comparator 16 is a transformer comprised of a toroidal Magnetic Core 46 and is disposed around Resistor 14. Resistor 14 serves as a single turn primary winding for the transformer. Toroidal Secondary Windings 48 (Winding 20 and 22 of FIG. 1) are wound on Core 46. Terminations (input and output connections) from the Windings 48 are brought out through a hole in the Member 28 as shown at 50 in FIG. 3 for connection to an external amplifier such as Amplifier 24 in FIG. 1.

Having described the above interrelationships of the various elements and component parts of the invention, it is significant to now point out the many advantages of those interrelationships which contribute to the invention's novel mechanical, electrical and functional characteristics.

It should be noted that all of the current carrying components of the Current Sensor 8 are preferably of a coaxial construction. As can be seen in FIG. 3, the Cup-Shaped Member 26 is circumferentially coaxially disposed around Resistor 12 by an Inner Wall 43 thereof which extends over a portion of Resistor 14 to a point 45 adjacent Conductor 32.

The above coaxial relationship is maintained throughout the Sensor 8, by the coaxial relationship of the Measurement Resistor 14 and Member 28, which are mounted coaxially with respect to each other as well as being coaxial with Member 26 and Resistor 12. Further, it will be noted that the transformer Core 46 of Comparator 16 is also coaxial with all of the other component parts of the Sensor by being coaxially disposed around Resistor 14.

The designer has several design choices available to achieve a desired output current, $I_{out}$, for a given input current, $I_{in}$. First the number of turns in the secondary windings of Comparator 16 can be readily changed. Second, the cross section areas of Shunt Resistor 12, Measuring Resistor 14, or both can be readily varied simply by changing their diameter. Third, the resistance alloys used for making Shunt Resistor 12 and Measuring Resistor 14 can be selected from the several low temperature coefficient materials previously described. Different alloys can be chosen for each of the resistors. Fourth, the lengths of Shunt Resistor 12 and Measuring Resistor 14 can be varied.

A basic understanding of the flow of current through the Sensor 8 and the operation of the Comparator 16 is relatively straight forward.

Let it be assumed that Conductors 30 and 32 of FIG. 3 are connected in series with a power source providing a current to be sensed or measured. The current to be measured, $I_{in}$, enters the Current Sensor 8 at Conductor 30 and Conductive Member 26 as shown by the arrows in FIG. 3.

The current, $I_{in}$ divides at the Connections 9 and 31 at the Face 27 of Member 26 to thus flow as currents $I_1$ and $I_2$ through Resistors 12 and 14 respectively. The current, $I_2$, to be measured flows through Resistor 14 and the Member 28, via an outer wall or shell 38 thereof. The current $I_2$, in the shell 38 flows into Conductor 32 at connection 39 where it is combined with the Current $I_1$ and thus combined as $I_1+I_2$, exits at the output of Conductor 32. The output current $I_1+I_2$ is, of course, equal to input current $I_{in}$.

As previously mentioned, Resistor 14 has a magnetic field surrounding it when current is flowing therethrough. The Current Comparator 16 senses the flux from this magnetic field and generates an output signal proportional to $I_{in}$. This output signal was previously described as $I_{out}$ in connection with the previous description of FIG. 1. Reference is made to that previous description for a basic understanding of the operation of Comparator 16.

It is noteworthy to point out at this time that the coaxial construction of the various elements of the Sensor 8 contain attributes which provide an interaction between the various self inductances of those elements, and the complex mutual inductances therebetween, which results in a Current Sensor design substantially void of any magnetic field being generated external to the sensor resulting from the current flowing through the sensor. Conversely, incident magnetic fields from other sources (including the sensor's own current entry and exit Conductors 30 and 32) have negligible effect on the operation and accuracy of the Sensor. As a result, multiple current sensors can be operated in close proximity with very little interaction between the sensors—a distinct benefit in many applications, such as watthour meters where multiple sensors are frequently used. A more detailed description and analysis of the above attributes will later be given.

Figure 4:
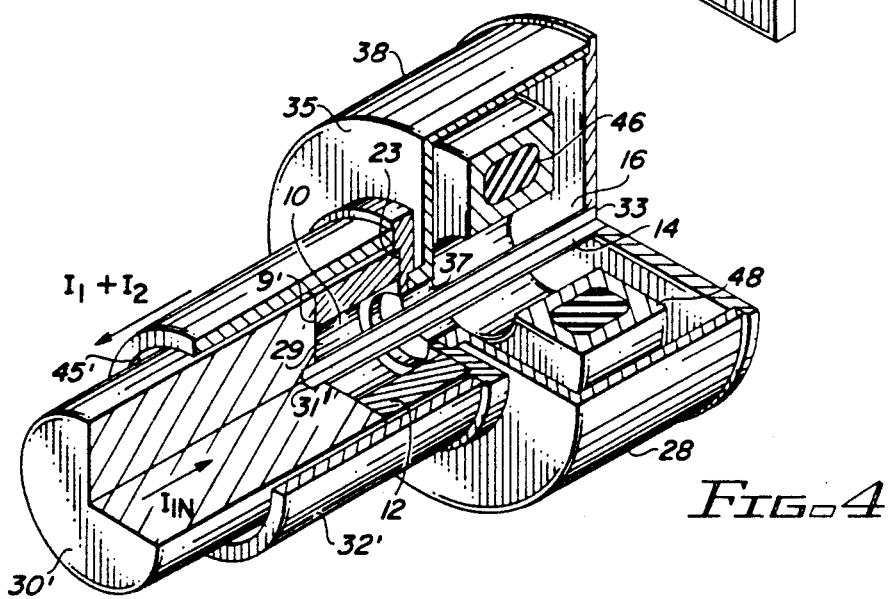
FIG. 4 is an isometric view of another embodiment of the current sensor of the present invention.

Reference is now made to FIG. 4 which shows another embodiment of the Current Sensor 8 which is substantially the same as the embodiment of FIGS. 2 and 3. In this embodiment, however, the entry and exit Conductors 30 and 32 (shown as 30' and 32') are coaxial with the total Sensor. This embodiment has the advantage that Conductors 30' and 32' may be coaxially longitudinally extended outward from the Sensor as far as is required. Like numbers in FIG. 4 correspond to like numbers in FIG. 3.

It should be noted that the currents $I_{in}$ and $I_1+I_2$ in FIG. 4 flow in opposite directions through adjacent parallel, coaxial paths. Such an arrangement has the advantage that the magnetic fields surrounding Conductors 30' and 32' are equal and opposite, to thus cancel each other out, with the attendant benefit that no external magnetic fields are generated, while simultaneously maintaining the Sensor substantially immune to the effects of incident magnetic fields in the vicinity of Conductors 30' and 32'.

It should be noted in FIG. 4 that the cup-shaped Member 26 is not required. In this embodiment the input current, $I_{in}$, is applied directly to Conductor 30' which is firmly bonded to Resistors 12 and 14 at 9' and 31' as shown. Further, it will be noted that Conductor 32' is an integral part of Member 28 and is firmly bonded to Resistors 12 and 14 at 23 and 33.

The operation of the Sensor of FIG. 4 is substantially as described for FIG. 3, and as such no further description is believed necessary.

Figure 5:
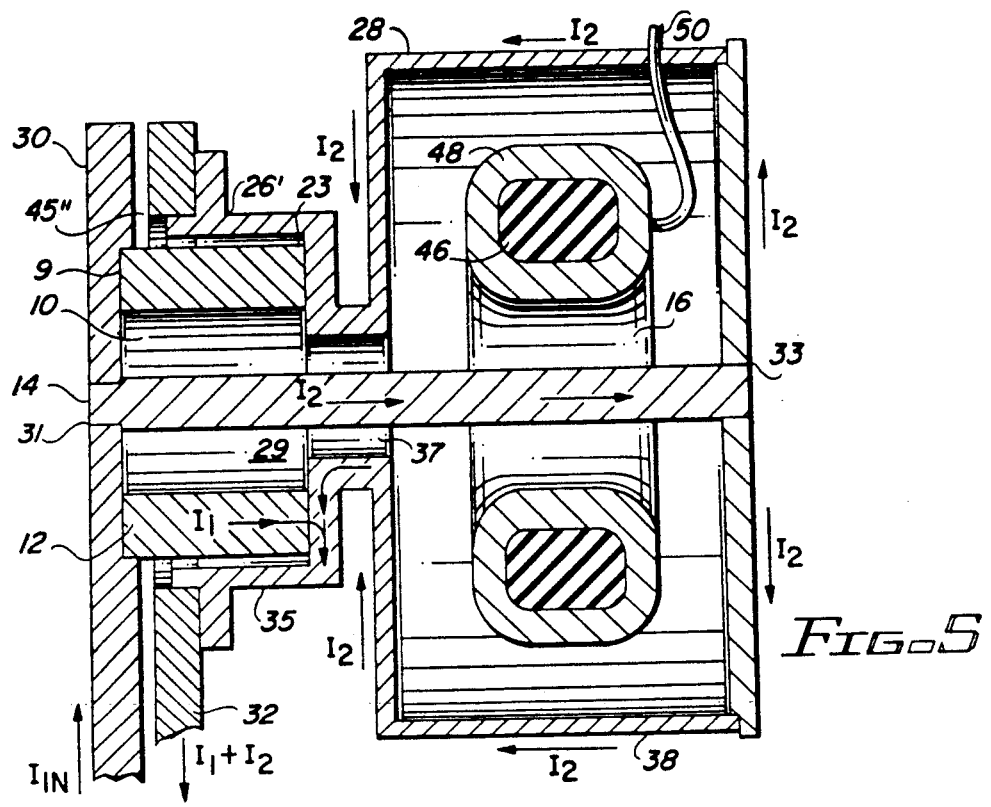
FIG. 5 is a sectioned view of still another embodiment of the current sensor of the present invention.

FIG. 5 shows still a further embodiment of the invention similar to FIG. 3 wherein the Current Divider 10 and Comparator 16 are both on the same side (ie, the outward end of Resistor 12) of the entry and exit Conductors 30 and 32. It should also be noted that Conductors 30 and 32 are re-arranged to be adjacent similar to Conductors 30' and 32' of FIG. 4, whereby the magnetic fields caused by currents $I_{in}$ and $I_1+I_2$ are substantially self cancelling.

In the embodiment of FIG. 5, the Cup-Shaped Member 26 forms an integral part of Member 28 as shown by the designation 26'. It will also be noted that the Conductor 30 serves as an end plate in place of the Bottom 27 of Member 26 of FIG. 3, and is joined to Resistors 12 and 14 to form the current dividing points for $I_{in}$.

The operation of the FIG. 5 embodiment is substantially as given for FIG. 1, 3 and 4, and no further explanation is believed necessary.

In furtherance of other details of the design and construction of the invention, reference is now made back to FIG. 3.

As previously pointed out, it can be seen that Measuring Resistor 14 is not the only resistive component of $R_2$. The Conductive Member 28, including its bottom cover or base 44 and cylindrical Shell 38, is in series with Measuring Resistor 14. Preferably, Member 28 is constructed of copper such that its resistance is less than 1% of the resistance of Resistor 14, thus making the effect in its change of resistance with temperature negligible.

It should also be noted that the Bottom 27 of Member 26 forms an equipotential surface with respect to Shunt Resistor 12 and Measuring Resistor 14. As such, within the inside diameter of Shunt Resistor 12, there is no current flow in Bottom 27 associated with the current $I_1$ in Resistor 12.

In a similar fashion, so long as Neck 40 of Member 28 has a diameter substantially equal to or less than the inside diameter of Shunt Resistor 12, then Conductor 32 is an equipotential surface with respect to Resistor 12 and Member 28.

Careful attention to the above connection and design principles permits Shunt Resistor 12 to be kept to a very low value of the order of 30-40 microohms with attendant low $I^2R$ losses, while still maintaining temperature independence. It should be noted, however, that the joints or bonds between Shunt Resistor 12 and Member 26 and Conductor 32 should have a very low resistance. As such, these bonds should be made with great care by brazing, welding or other suitable processes.

In the foregoing description, all of the current carrying elements of the Sensor 8 have been specified as preferably copper, with the exception of Resistors 12 and 14. Other low resistance materials, such as aluminum, could be used, however, the low cost of copper and the difficulties associated with joining to aluminum make copper the preferred choice.

A detailed analysis and a teaching of the design principles of the invention will now be given.

Figure 6A:
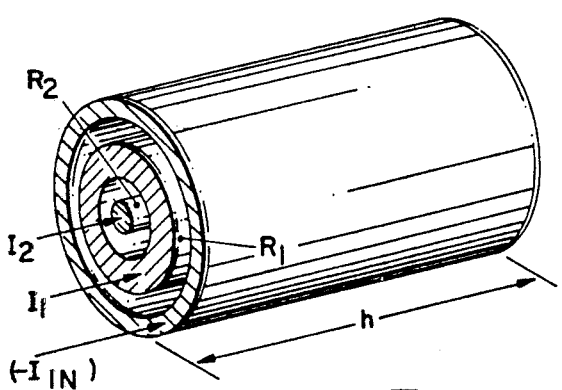
FIG. 6a is an isometric view of a current divider in accordance with the principles of the invention.
Figure 6B:
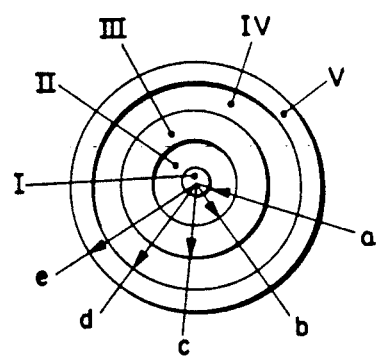
FIG. 6b is an elevation drawing of the current divider of FIG. 6A and is useful in understanding the operation and design principles of the invention.
Figure 6C:
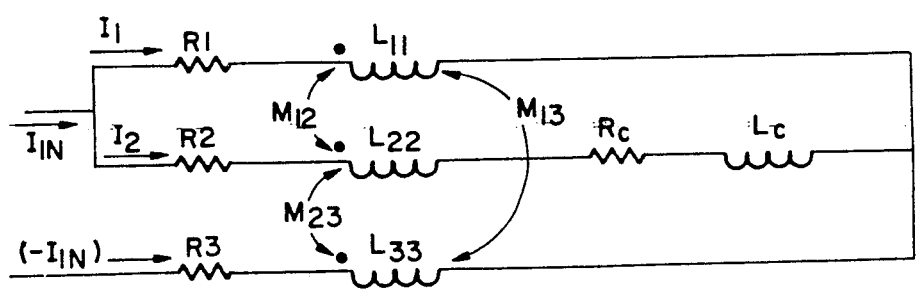
FIG. 6c is an equivalent circuit of the current sensor and is useful in understanding the operating and design principles of the invention.

Referring to FIG. 6, there is shown in FIG. 6a an isometric view of the Sensor 8 and Coaxial Current Divider 10. FIG. 6b is an elevation of the Current Divider, and in FIG. 6c there is shown an equivalent circuit of the Current Sensor showing the self and mutual inductances in the Sensor.

In FIG. 6a, there are shown the currents $I_{in}$, $I_1$, and $I_2$ corresponding to these same currents as previously described for FIGS. 1-3. Also shown is a length "h", corresponding to the length of the Sensor or Coaxial Divider 10.

In FIG. 6b the radii of the various components of the Coaxial Current Divider are shown together with Roman numbers I through V, indicating five volumes associated with these radii and the length "h" of the Divider.

In FIG. 6c, a self inductance $L_{11}$ and Resistance $R_1$ are associated with the conductor carrying $I_1$, i.e. Shunt Resistor 12. Similarly self inductance $L_{22}$ and Resistance $R_2$ are associated with $I_2$ and Measuring Resistor 14 while self inductance $L_{33}$ and Resistance $R_3$ are associated with $I_{in}$ and Conductive Member 26. $M_{12}$, $M_{13}$ and $M_{23}$ are the mutual inductances between the conductors carrying $I_1$, $I_2$ and $I_{in}$. Self inductance $L_c$ and resistance $R_c$ are associated with that part of Measuring Resistor 14 that is outside the Coaxial Current Divider and include the Conductive Member 28 and the reflected impedance of Current Comparator 16 and its associated Amplifier 24 as seen by the single turn primary winding formed by Measuring Resistor 14.

Analysis of the circuit in FIG. 6c shows the current divider ratio to be;

$$\frac{I_2}{I_{in}} = \frac{1}{K} = \frac{(R_1) + j\omega(L_{11} - M_{12} - M_{13} + M_{23})}{(R_1 + R_2 + R_C) + j\omega(L_{11} - M_{12} + L_{22} - M_{12} + L_C)} \quad (4)$$

It should be observed that $L_{33}$ and $R_3$ do not appear in expression (4) and thus do not affect the divider ratio.

The resistances $R_1$ and $R_2$ are those associated with volumes I and III in FIG. 6b and are given by;

$$R_1 = \frac{\rho_1 h}{\pi(c^2 - b^2)} \quad (5)$$

$$R_2 = \frac{\rho_2 h}{\pi a^2} \quad (6)$$

where $\rho_1, \rho_2$ are the resistivities of the materials of $R_1$, $R_2$

To calculate the inductances it must first be noted that due to the coaxial construction, there is no magnetic field beyond the outside radius "e" of the outer conductor (ie, the outside radius of Sensor 8). This can be shown by using Amperes circuital law along a circular path just outside cylindrical Member 26.

$$\oint H \cdot dl = I$$

Since no net current is enclosed and the system has circular symmetry, $H_\phi$, the tangential component, must equal zero.

Energy relationships can now be used to calculate the inductances. The energy stored in a magnetic field is;

$$W_H = \frac{1}{2} \int_{vol} B \cdot H dV \quad (7)$$

Since there is no magnetic material in the system of FIG. 6 then, $B = \mu_0 H$ and;

$$W_H = \frac{\mu_0}{2} \int_{vol} H^2 dV \quad (8)$$

The energy stored in the magnetic field is also given by;

$$W_H = \tfrac{1}{2} L I^2 \quad (9)$$

From equations (8) and (9) we get;

$$L = \frac{\mu_0}{I^2} \int_{vol} H^2 dV \quad (10)$$

Equation (10) has to be evaluated for the volumes I through V in FIG. 6b.

Consider a typical thin cylindrical shell coaxial with the system having a radius r, thickness dr and a volume dV;

$$dV = h \times 2\pi r dr \quad (11)$$

Substituting in equation (10) we get;

$$L = \frac{\mu_0 2\pi h}{l^2} \int_{r_1}^{r_2} H^2 r\, dr \tag{12}$$

We note that;

$$H = \frac{I'}{2\pi r} \tag{13}$$

Where I' is the current enclosed at the radius r $$L = \frac{\mu_0 h}{2\pi (I)^2} \int_{r_1}^{r_2} (I')^2 \frac{1}{r}\, dr \tag{14}$$

Similarly it can be shown that the mutual inductances are given by;

$$M = \frac{\mu_0 h}{2\pi I_1 I_2} \int_{r_1}^{r_2} (I_1')(I_2') \frac{1}{r}\, dr \tag{15}$$

where $I_1'$, and $I_2'$ are the currents in Resistances 12 and 14 enclosed at the radius r.

Expressions (14) and (15) can be evaluated for values of r between 0 (center of R2 axis) and "e", the outside diameter of the outer conductor (Member 26), in order to calculate $L_{11}$; $L_{22}$; $M_{12}$; $M_{13}$; $M_{23}$.

It is found that $M_{23} = M_{13}$, thus equation (4) becomes;

$$\frac{I_2}{I_{in}} = \frac{1}{K} = \frac{(R_1) + j\omega(L_{11} - M_{12})}{(R_1 + R_2 + R_C) + j\omega(L_{11} - M_{12} + L_{22} - M_{12} + L_C)} \tag{16}$$

It is also found that;

$$(L_{11} - M_{12}) = \tag{17}$$

$$\frac{\mu_0 h}{2\pi} \left[ \left( \frac{b^2}{c^2 - b^2} \right) \cdot \ln\left(\frac{c}{b}\right) + \ln\left(\frac{c}{a}\right) - \frac{1}{4} \right]$$

$$(L_{22} - M_{12}) = \tag{18}$$

$$\frac{\mu_0 h}{2\pi} \left[ \left( \frac{b^2 c^2}{(c^2 - b^2)^2} \right) \cdot \ln\left(\frac{c}{b}\right) - \frac{(c^2 + b^2)}{4(c^2 - b^2)} \right]$$

It will be noted that equations (5); (6); (17) and (18), which evaluate the separate terms of equation (16), each contain terms only in the dimensions a, b, c, and h (FIG. 6b). The divider ratio is therefore dependent only on the dimensions of Shunt Resistor 12 and Measuring Resistor 14, and is entirely independent of the dimensions of cylindrical Member 26.

It is found that the term $(L_{11} - M_{12})$ from equation (17) is always negative for practical values of a, b and c, while the term $(L_{22} - M_{12})$ from equation (18) is always positive and larger than $(L_{11} - M_{12})$. Therefore, from equation (16), it can be seen that $I_2$ will always lag $I_{in}$ by a small angle.

The above analysis has ignored the self and mutual inductances that result from the radial current flows in Bottom 27 and Conductor 32. These inductances are very small, however, and the close agreement between the results of the above analysis and measurements on actual models justify ignoring the end effects.

A design engineer now has all the information needed to design the Current Sensor 8 and Divider 16 and accurately predict its performance.

In most applications it is required that the Current Sensor has an accurate fixed ratio between the input current ($I_{in}$) and the output current or signal ($I_{out}$). The Current Comparator section of the disclosed sensor has an accurate ratio determined by the number of turns in the Secondary Windings. The Current Divider section described above, however, has a ratio dependent on the dimensions a, b, c, h and the resistivity of the materials in the Shunt Resistor 12 and Measuring Resistor 14.

The dimensions and resistivities all have manufacturing tolerances such that the nominal divider ratio in equation (16) may vary by about ±5% as manufactured and, thus, there may be a need for an adjustment process.

Figure 7:
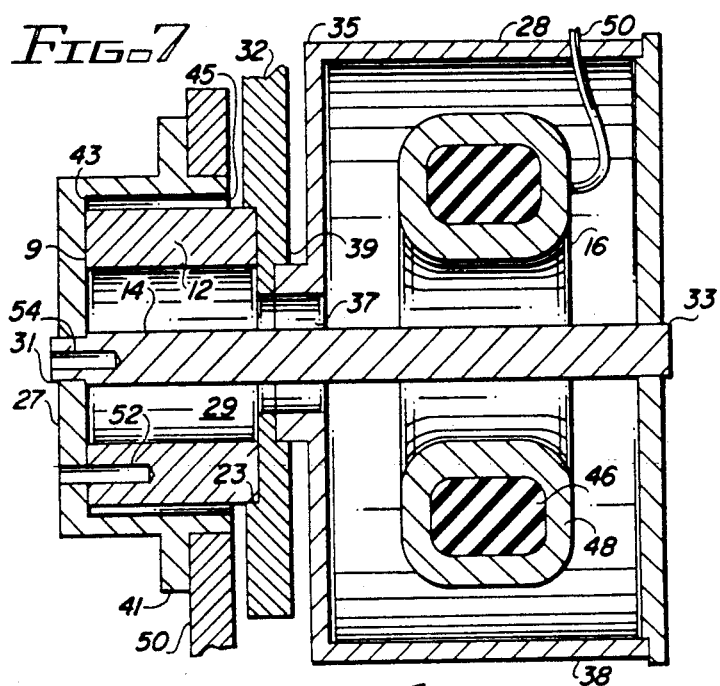
FIG. 7 is a sectioned view similar to FIG. 3, but showing details of a structure and method of adjusting the ratio of the current divider of the present invention.

FIG. 7 shows a simple method of making such adjustments in the Sensor by drilling one or more holes 52 through Bottom 27 and into Shunt Resistor 12. A hole such as this has the effect of reducing the cross sectional area of Shunt Resistor 12 and thereby increasing its resistance $R_1$. In a typical design where b=0.188" and c=0.312", the effective area of Shunt Resistor 12 is equivalent to a solid cylinder 0.500" diameter. Since the wall thickness of the cylinder is 0.125", it is easy to drill in it a hole 0.050" diameter, i.e. 10% of the equivalent diameter. This hole has an area equal to 1% of the cylinder and, if drilled right through the cylinder would increase the resistance $R_1$ by 1%. By drilling a shorter hole of appropriate depth, adjustment to within less than 0.1% of the desired value can be achieved. If more than 1% adjustment is required, larger holes or multiple holes can be used. This method of adjustment will of course only increase $R_1$ and thus increase $I_2$ in equation 16. If an adjustment in the opposite direction is required, it also is possible to drill a hole 54 in Measuring Resistor 14, however, since the radius "a" of this resistor is quite small, typically 0.04" to 0.08", it is more difficult to drill a hole and its effect on the ratio is much greater.

The preferred method of adjustment is to design the Sensor such that, the nominal ratio is sufficiently less than the desired ratio so that all manufactured assemblies, even at maximum tolerance, have a ratio less than desired; thus permitting all adjustments to be made by drilling hole(s) 52 in Shunt Resistor 12. The adjustment can then be readily performed with automated measuring and drilling equipment.

Figure 8A:
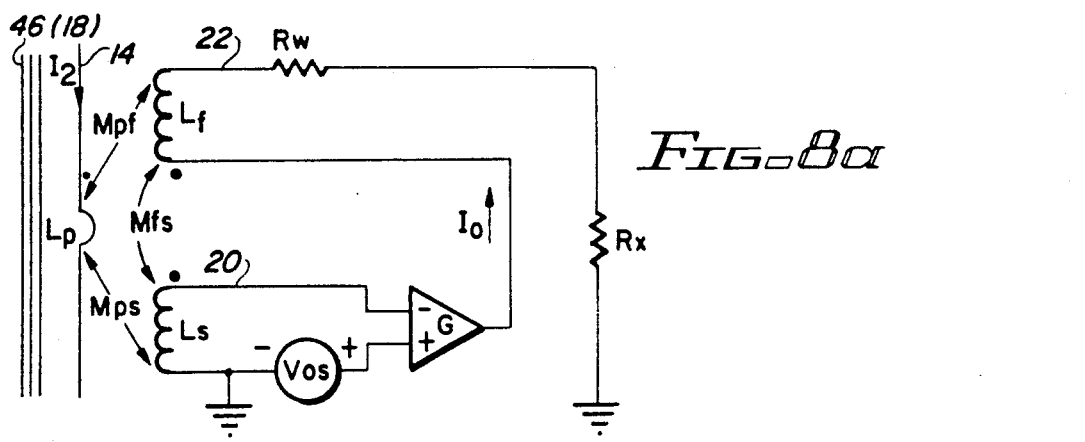
FIG. 8a is a schematic diagram of a current comparator and circuit useful in understanding the principles of the invention.

Referring now to FIG. 8a there is shown the basic equivalent circuit of the Current Comparator 16. For a.c. signals it can be shown that the comparator ratio is;

$$\frac{I_0}{I_2} = \frac{1}{N} = \frac{-\omega(GM_{ps} + M_{pf})}{\omega(GM_{fs} + L_f) - j(R_w + R_x)} \tag{19}$$

Since the sense and feed back windings 20 and 22 are toroidally wound on a high permeability toroid Core 18, there is virtually no leakage flux and if the sense and feedback windings have $N_s$ and $N_f$ turns, while the primary winding (Resistor 14) has one turn then;

$$M_{ps} = KN_s$$
$$M_{pf} = KN_f$$
$$M_{fs} = KN_fN_s$$
$$L_f = K(N_f)^2$$
(20)

Where K is a constant dependent on the dimensions of toroid Core 18 and the permeability of the core material. Combining equations (19) and (20) we get;

$$\frac{I_0}{I_2} = \frac{1}{N} = \frac{-\omega K(GN_s + N_f)}{\omega KN_f(GN_s + N_f) - j(R_w + R_x)}$$
(21)

Since W, K, $N_f$ and G are large compared to $R_w$ (winding 22 resistance) and $R_x$ (load resistance), the last term in the denominator $j(R_w + R_x)$ has no effect on magnitude and negligible effect on the phase angle and can be ignored, hence;

$$\frac{I_0}{I_2} = \frac{1}{N} = -\frac{1}{N_f}$$
(22)

In the analysis above the amplifier input d.c. offset voltage, $V_{os}$, was ignored. This small input voltage, present in all amplifiers, has no feedback path from the amplifier output to the amplifier input, and consequently will be amplified by the large open loop gain, G, of the amplifier and will drive the output of the amplifier to saturation and prevent the amplifier from operating in a linear fashion. This problem can be overcome by the prior art solutions shown in FIGS. 8b and 8c and disclosed in U.S. Pat. Nos. 4,182,982 and 4,761,605. These patents are incorporated herein by reference for a detailed description of the operation of such circuits. A brief explanation of the circuits, however, will be given.

Figure 8B:
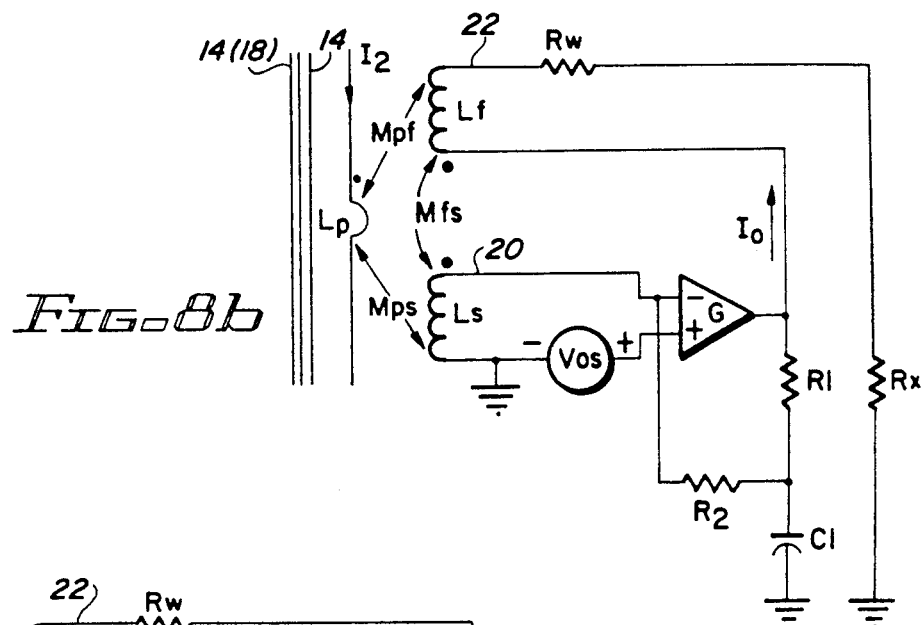
FIG. 8b is a schematic diagram of a current comparator with a d.c. stabilization circuit further useful in understanding the principles of the invention.
Figure 8C:
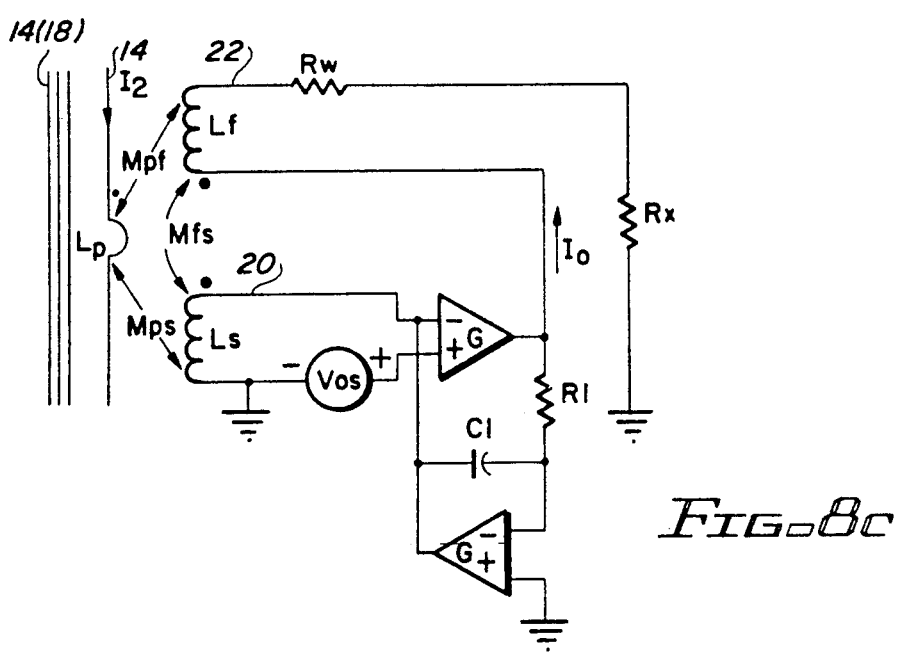
FIG. 8c is a schematic diagram of a current comparator with a different d.c. stabilization circuit.

In the circuits of FIGS. 8b and 8c, a d.c. feedback path is provided in the form of a low pass filter. If the Current Comparator is to operate with high accuracy, the low pass filter must have high attenuation at 50/60 Hz. power frequencies which results in a time constant for the $R_1$—$C_1$ circuit of several seconds.

For practical application of the current sensor to power circuit measurements, a long time constant is unacceptable, because the large transients found in these circuits may cause shock excitation of the amplifier and result in a large slowly decaying oscillation.

An improved circuit for this purpose is disclosed in the aforementioned U.S. Pat. No. 4,761,605, which is assigned to the assignee of the present invention. The disclosures of that patent are incorporated herein by reference. FIG. 9a shows the circuit of that disclosure, and which differs from FIG. 8a only by the inclusion of a set of switches A and B. The switches, which may be suitable FET or CMOS semiconductor devices, are arranged so that when switches A are closed or "ON", switches B are open or "OFF"; and when switches A are open or "OFF", switches B are closed or "ON".

Figure 9B:
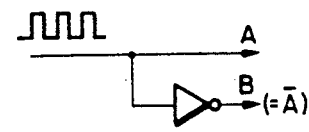
Figure 9A:
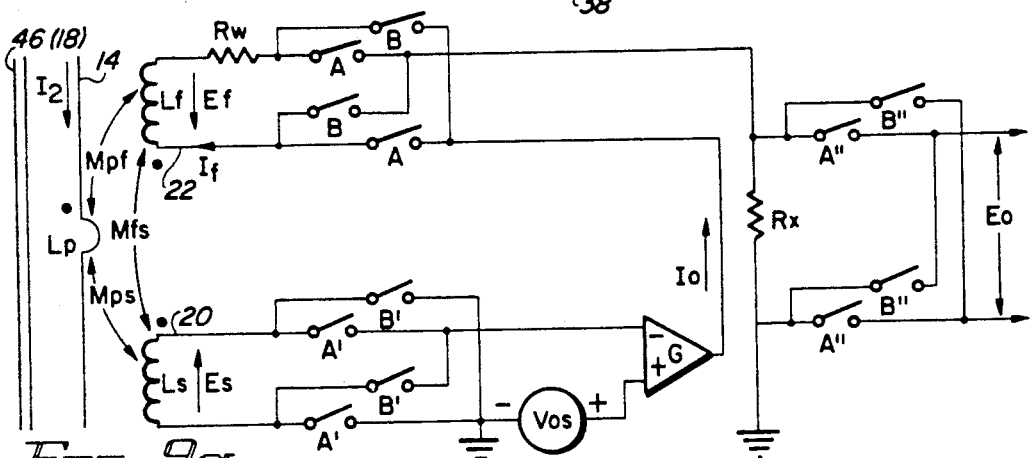
FIG. 9a is a schematic diagram of a current comparator with a switched d.c. stabilization circuit according to the present invention.

FIG. 9b shows a suitable control circuit which is responsive to a square wave input signal to provide control signals for switching switches A and B.

Figure 9C:
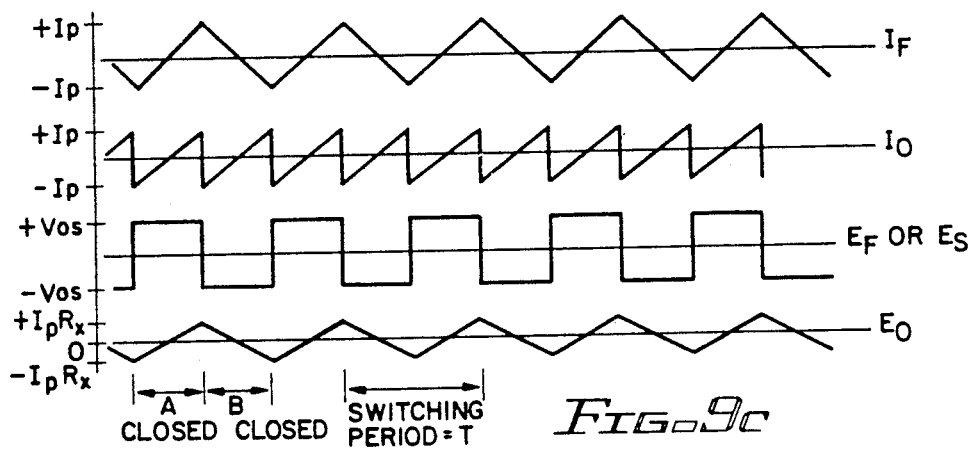

FIG. 9c shows the waveforms for the voltages and currents in the circuit of FIG. 9a. (Note that the waveforms are shown when $I_2=0$)

As described in U.S. Pat. No. 4,761,605, the principle of the circuit is to convert a d.c. signal $I_0$ at the amplifier output to an a.c. signal $I_f$ at the feedback winding 22 by means of the reversing switches A and B. The a.c. signal $I_f$ is coupled from the feedback winding 22 to the sense winding 20 by the mutual inductance $M_{fs}$ and if $N_s=N_f$ then $E_s=E_f$. The a.c. signal $E_s$ from the sense winding 20 is synchronously rectified by the second set of reversing switches A' and B' and thus converted back to a d.c. voltage suitable to cancel the amplifier offset voltage $V_{os}$.

It will be seen that the triangular wave of the current $I_f$ in the feedback winding 22 ($L_f$) generates a square wave of voltage ($E_f$, $E_s$) in both the sense and feedback windings 20 and 22 ($L_s$ and $L_f$) according to the equation;

$$E_s = E_f = M_{fs}\left(\frac{2I_p}{0.5T}\right) = L_f\left(\frac{2I_p}{0.5T}\right)$$
(23)

The commutating effect of the switches reverses the negative half of the $E_s$ waveform, thereby creating a constant voltage $V_{os}$ at the inverting (−) input of the amplifier which cancels the inherent offset voltage of the amplifier. The $I_o$ current waveform will be superimposed on the normal $I_o$ current as an error signal. From equation (23);

$$I_{err(pk-pk)} = 2I_p = \frac{V_{os}T}{2L_f}$$
(24)

The error signal is proportional to $V_{os}$ and can be minimized by increasing the inductance of the feedback winding 22 ($L_f$) or increasing the switching frequency, thus decreasing the switching period T shown in FIG. 9c. If the switching frequency is in the order of a few hundred hertz and the inductance of the feedback winding 22 ($L_f$) is several henries, the error signal is less than 1 microamp peak to peak (i.e., +Ip−(−Ip)) per millivolt of amplifier offset voltage.

In many a.c. power applications the Current Sensor is used to provide an input signal to a watt or watthour meter. In such applications, a multiplication process is used between the current signal and a voltage signal to generate an instantaneous watts signal. The voltage signal will normally contain only the fundamental power frequency and harmonics thereof. If the switching frequency of the amplifier stabilization circuit is chosen *not* to be a harmonic of the power frequency there will be no correlation with the voltage signal and the effect of the error signal will average to zero over a cycle of the power line frequency. See U.S. Pat. No. 4,761,605 for more information regarding this multiplication process.

In other applications, a higher switching frequency will reduce the error signal and also make it easier to attenuate the error signal by filtering if required.

The switches A and B, while accomplishing d.c. feedback, also invert the desired signal component in $I_o$ and a third set of switches A" and B" may be used to remove this signal inversion as shown in FIG. 9a.

An additional feature of the current comparator, not previously described, is an Electrostatic Shield shown at 56 in FIG. 3. It will be appreciated that all of the conductive metal parts of Current Divider 10 may be at the line voltage of the power system to which Current Divider 10 is connected in order to measure the line current. Current Comparator 16, on the other hand is connected to Amplifier 24, which is part of the electronic circuit of, for example, a watthour meter. Since the electronic circuit is very sensitive to electrical noise and extraneous signals, it is normal practice to connect this circuit to a ground reference. Therefore, a large AC voltage difference exists between Cup-Shaped Member 28 (being part of Current Divider 10) and Current Comparator 16.

A first outcome of this voltage difference is a requirement to provide an insulation structure between Cup-Shaped Member 28 and Current Comparator 16, capable of withstanding this voltage difference. Such an insulation structure may readily be provided in the form of a molded plastic housing around Current Comparator 16. The described structure has been omitted from the figures in the interests of clarity.

A second outcome of the voltage difference is the presence of capacitive coupling between Cup-Shaped Member 28 and Windings 48 of Current Comparator 16. Such capacitive coupling, particularly to Secondary Winding 22, may result in an undesired error signal at the input to Amplifier 24 where the input signal in normal operation is close to zero. To overcome this error signal problem, it is desirable to enclose Windings 48 within a conductive Electrostatic Shield 56 as shown in FIG. 3. Such a shield is well known in the art as a Faraday Shield may take many forms, such as a conductive or metallic coating on the inside surfaces of the previously mentioned molded plastic housing, or a separate thin metal enclosure for Current Comparator 16, located within the insulation structure.

The shield is required to be connected to the ground reference of the electronic circuit and may also enclose Winding Connections 11, 17, 19, and 21 between Current Comparator 16 and Amplifier 24 in the form of a shielded cable.

Electrostatic Shield 56 preferably should enclose Windings 48 to the greatest possible extent, but it is important that in so doing, a complete closed turn is not created around toroid Core 46, whereby current could flow within the shield and cause additional ampere turns around the core resulting in large errors in Current Comparator 16. To this end, a small Gap 58 may be left in Electrostatic Shield 56 to prevent formation of a closed turn. As an alternative solution, the edges of Electrostatic Shield 56 may be lapped one over the other, but insulated from one another, to prevent completion of a closed turn.

While several preferred embodiments of my novel current sensor have been described with some particularity herein, many variations and modifications will now become apparent to those skilled in the art. By way of example, while the coaxial current sensor is disclosed as being an assembly of cylindrically shaped components, the conductive Members 26 and 28, the Resistors 12 and 14 and the Current Comparator 16, need not be cylindrical, but may be of rectangular or other shapes which are interrelated and bonded together to perform multiple current scaling and provide a current sensor. These embodiments may lose some of the attributes of the preferred embodiments such as absence of external magnetic fields, immunity to incident magnetic fields and minimal phase error between the input current to the sensor and the output signal of the sensor but still provide adequate performance in many applications.

It is contemplated that the invention will have applications as a current sensor where high accuracy is not a requirement. To that end, it is expressly contemplated that the alloys of Resistors 12 and 14, which are disclosed as resistive materials preferably having very low temperatures coefficient of resistance, be replaced by other conductive materials, such as copper and aluminum, or resistance alloys having higher temperature coefficients of resistance.

While a coaxial design of the Current Sensor 8 is disclosed as that design which meets the overall objectives of a highly accurate current sensor, it is understood that such a design may not have to be totally coaxial. For example, it is contemplated that an operational current sensor may be constructed of at least some parts, which are not coaxially related, and which still provides the attendant advantages of Sensor 8 by an interrelationship of component parts which provides the required divisions of current and the interrelationships of the self and mutual inductances between the current carrying parts of the sensor to provide a scaled output signal, $I_{out}$, which is sufficiently accurate for at least some current measurement applications. Accordingly, I intend to be limited only by the scope of the appending claims and not by the particular details presented by way of example herein.

What is claimed is:

1. A coaxial current sensor for providing an output signal proportional to current supplied thereto, comprising:
   (a) a coaxial current divider for dividing current supplied thereto, including,
      (i) a first conductor, having an aperture extending therethrough between opposite ends thereof, possessing a resistance of a value $R_1$,
      (ii) a second conductor coaxially disposed in the aperture of said first conductor, said second conductor being connected at opposite ends thereof to corresponding opposite ends of said first conductor, and possessing a resistance of a value $R_2$, whereby an input current, $I_{in}$, supplied to one end of said first and second conductors, divides into currents $I_1$ and $I_2$ flowing in said first and second conductors respectively, and wherein the current $I_2$ flowing in said second conductor is given by:

$$I_2 = \frac{I_{in}}{K} \text{ where } K = \left[ \frac{R2}{R1} + 1 \right]; \text{ and}$$

(b) output means coaxially disposed about said second conductor and inductively coupled thereto, for sensing the current $I_2$ flowing in said second conductor and providing an output signal having a magnitude proportional to the magnitude of the current $I_{in}$ supplied to said current sensor.

2. The coaxial current sensor in accordance with claim 1, wherein said first and second conductors are comprised of materials having temperatures coefficient of resistance less than that of copper.

3. The coaxial current sensor in accordance with claim 2, wherein the resistance $R_1$ of said first conductor is less than the resistance $R_2$ of said second conductor.

4. The coaxial current sensor in accordance with claim 3, wherein said first conductor has a larger cross-section than the cross-section of said second conductor to thereby establish the values of $R_1$ and $R_2$ respectively.

5. The coaxial current sensor in accordance with claim 1, wherein said output means comprises a toroidal core transformer, having wound thereon first and second secondary windings, coaxially disposed around said second conductor, whereby said said second conductor serves as a primary winding for said toroidal core transformer.

6. The coaxial current sensor in accordance with claim 5, wherein said toroidal core transformer is a current comparator, and further including an amplifier, having a small offset voltage, and having an input connected to said first secondary winding for sensing magnetic flux in the toroidal core and an output connected to said second secondary winding for providing a compensating signal to said second secondary winding to maintain the flux in the toroidal core at substantially zero, and switching means connected between said amplifier and each of said first and second secondary windings, whereby the small offset voltage is converted to an A.C. signal, coupled through said first and second secondary windings, and rectified to compensate for the offset voltage at the input to said amplifier.

7. The coaxial current sensor in accordance with claim 6, wherein said second secondary winding includes an output terminal for providing the output signal from said output means to a load.

8. The coaxial current sensor in accordance with claim 1, wherein said first and second conductors and said output means are enclosed by first and second conductive members, said first and second conductors, each being connected at opposite ends thereof to a corresponding one of said first and second conductive members to form said coaxial current divider, whereby the input current $I_{in}$, when supplied to one of said first and second conductive members, divides into the currents $I_1$ and $I_2$ flowing in said first and second conductors to thereby be combined, in the other one of said first and second conductive members, as $I_1 + I_2$ equal to $I_{in}$.

9. A current sensor for providing an output signal proportional to current supplied to the sensor, comprising:
(a) a current divider for dividing current supplied thereto, including,
    (i) a shunt resistor having an aperture extending therethrough between opposite ends thereof,
    (ii) a current measuring resistor coaxially disposed in the aperture of said shunt resistor,
    (iii) conductor means connecting one end of said current measuring resistor to one end of said shunt resistor, whereby current supplied to said current divider may flow through said current measuring resistor and said shunt resistor,
    iv) a conductive, cup-shaped, member bonded at its open end to the other end of said shunt resistor and having disposed, on the inside thereof, said current measuring resistor, said current measuring resistor being bonded, at the other end thereof, to said cup-shaped member, whereby current flowing in said current measuring resistor and said cup-shaped member is combined with the current flowing in said shunt resistor to thereby provide an exit point for the total current flowing in said current sensor; and
b) a current comparator, disposed inside said cup-shaped member, for sensing the current flowing in said current measuring resistor and providing an output signal having a value proportional to the magnitude of the current supplied to said current sensor.

10. A coaxial current sensor, comprising;
(a) a coaxial current divider for dividing current supplied thereto, including,
    (i) a first conductor, having an aperture extending therethrough between opposite ends thereof, possessing a resistance of a value $R_1$,
    (ii) a second conductor coaxially disposed in the aperture of said first conductor, said second conductor being connected at opposite ends thereof to corresponding opposite ends of said first conductor, and possessing a resistance of a Value $R_2$, whereby an input current, $I_{in}$, supplied to one end of said first and second conductors, divides into currents $I_1$ and $I_2$ flowing in said first and second conductors respectively, and wherein the current $I_2$ flowing in said second conductor is given by:

$$I_2 = \frac{I_{in}}{K} \text{ where } K = \left[ \frac{R2}{R1} + 1 \right]; \text{ and}$$

(b) a current comparator including, a toroidal core of magnetic material having first and second secondary windings wound thereon, said toroidal core being coaxially disposed about said second conductor, said second conductor serving as a primary winding for inducing a voltage in said first and second secondary windings; and
(c) an amplifier having an input connected to said first secondary winding for sensing magnetic flux in said toroidal core and an output connected to said second secondary winding for providing a compensating signal to said second secondary winding to maintain flux in said toroidal core at substantially zero.

11. A current sensor comprising:
(a) a, conductive, first housing, having a closed end and an open end and including a first terminal for supplying input current thereto;
(b) a first resistor, disposed in said housing, and attached at one end thereof to the closed end of said housing, said first resistor having an aperture extending therethrough in coaxial alignment with said first housing, and being isolated from said first housing except at its point of attachment thereto;
(c) a second resistor coaxially disposed in the aperture of said first resistor and being in coaxial alignment with said first housing, said second resistor being isolated from said first resistor and having one end thereof attached to the closed end of said first housing and having a portion thereof, at its other end, extending beyond said first resistor;
(d) a, conductive, second housing, having a closed end and an open end, said second housing having disposed therein, from its open end, a portion of said second resistor, said second resistor being attached, at its other end, to the closed end of said second housing, and said second housing being attached, at its open end, to the other end of said first resistor, said second resistor being isolated from said second housing except at its point of attachment thereto, said second housing including a second terminal for carrying current exiting from said current sensor; and (e) a current comparator, mounted inside said second housing, and inductively coupled to said second resistor for sensing current flowing therethrough and providing an output signal having a value proportional to the magnitude of input current supplied to said current sensor.

12. A current divider, comprising:

(a) a, conductive cup-shaped, member, including a base on one end, and having formed, on the other end therof, a first, hollow elongated, conductor coaxially disposed around an opening in said member;

(b) a first resistor, having an aperture extending therethrough between opposite ends thereof, disposed inside said hollow elongated conductor, and bonded, at one end thereof, to said member in coaxial alignment with the opening in said member;

(c) a second conductor, disposed within said first hollow elongated conductor, in coaxial alignment with said first resistor, said second conductor having first and second ends and being attached at the first end thereof to the other end of said first resistor; and (d) a second resistor, passing through the opening in said member in coaxial alignment with said first resistor and said second conductor, and being attached at opposite ends thereof to the first end of said second conductor and the base of said member.

13. The current divider in accordance with claim 12, wherein said first and second hollow elongated conductors each include means for connecting said current divider in series with a current to be supplied to said current divider, and wherein said member, said first, hollow elongated conductor, said first resistor, said second conductor, and said second resistor are each of cylindrical shape.

14. The current divider in accordance with claim 13, further including means, disposed inside said member in coaxial alignment with said second resistor, for sensing a current component flowing in said second resistor and generating an output signal having a magnitude proportional to the magnitude of the current to be supplied to said current divider.

15. The current divider in accordance with claim 12, wherein said first and second resistors are comprised of materials having temperatures coefficient of resistance less than that of copper.

16. The current divider in accordance with claim 15, wherein the resistance of said first resistor is less than the resistance of said second resistor.

17. The current divider in accordance with claim 16, wherein said first resistor is of a larger cross-section than said second resistor.

18. A coaxial current divider for dividing current, supplied thereto, in a pre-determined ratio, comprising:

(a) a, cylindrical, first conductor having a cylindrical aperture extending therethrough between first and second ends thereof, including entry means for providing an input current $I_{in}$ to said first end, said first conductor possessing a resistance of a value $R_1$, and generating a first magnetic field therearound in response to a current flowing between the first and second ends thereof;

(b) a, cylindrical, second conductor, having first and second ends, coaxially disposed within the aperture of said first conductor, the first and second ends of said second conductor each being connected to a corresponding one of the first and second ends of said first conductor, said second conductor generating a second magnetic field therearound, in response to a current flowing between the first and second ends thereof, said second conductor possessing a resistance of a value $R_2$, whereby said input current, $I_{in}$, divides into currents $I_1$ and $I_2$ flowing in said first and second conductors respectively, and wherein $I_1 + I_2 = I_{in}$ and current $I_2$ flowing in said second conductor is given by:

$$I_2 = \frac{I_{in}}{K} \text{ where } K = \left[ \frac{R2}{R1} + 1 \right]; \text{ and}$$

(c) a, cylindrical, third conductor, having a cylindrical aperture extending therethrough between first and second ends thereof, and coaxially disposed around said first conductor, said third conductor being connected at the second end thereof to each of the second ends of said first and second conductors, said third conductor generating a third magnetic field therearound in response to a current flowing between the first and second ends thereof, said third conductor including means, at the first end thereof, for exit of the current $I_{in}$, the currents $I_1$, $I_2$ and $I_{in}$ flowing through said first, second and third conductors, and producing, respectively the first, second and third magnetic fields in a predetermined interacting relationship, such that, when the currents $I_1$ and $I_2$ flow from the first ends to the second ends of each of said first and second conductors, the current, $I_{in} = I_1 + I_2$, flows from the second end to the first end of said third conductor, whereby, beyond the outer surface of said third conductor, the sum of the first, second and third magnetic fields is substantially zero.

19. The coaxial current divider in accordance with claim 18, wherein said first and second conductors are comprised of materials having temperatures coefficient of resistance less than that of copper.

20. The coaxial current divider in accordance with claim 19, wherein the resistance $R_1$ of said first conductor is less than the resistance of $R_2$ of said second conductor and said third conductor is comprised of a low resistance material having substantially no effect on the current flowing therein.

21. The coaxial current divider in accordance with claim 20, wherein said first conductor has a larger cross-section that the cross-section of said second conductor to thereby establish the values of $R_1$ and $R_2$ respectively, and thus define the value K and the pre-determined ratio of said coaxial current divider as given by:

$$I_2 = \frac{I_{in}}{K}$$

22. The coaxial current divider in accordance with claim 18, further including output means coaxially disposed around said second conductor, said output means being inductively coupled to said second conductor, and responsive to the second magnetic field therearound, for sensing the current $I_2$ flowing in said second conductor and generating a scaled output signal having a magnitude proportional to the magnitude of the current $I_{in}$ supplied to said coaxial current divider, and wherein the interacting relationship of the first, second and third magnetic fields further results in a reduction of the phase angle between $I_2$ and $I_{in}$, whereby said scaled output signal is substantially in phase with the current $I_{in}$.

23. A coaxial current divider, comprising:
   (a) outer, intermediate and inner, cylindrical, conductors, coaxially disposed one within another and spaced apart at the cylindrical surfaces thereof, each having a first and a second end, and each being conjoined at the respective first ends thereof;
   (b) first means for making a first current connection to the second end of said outer conductor; and
   (c) means for conjoining said inner and said intermediate conductors at the respective second ends thereof, whereby said inner and said intermediate conductors are connected in parallel for dividing current supplied to said coaxial current divider, said means for conjoining including, second means for making a second current connection to said coaxial current divider.

24. A coaxial current divider in accordance with claim 23, further including means coaxially disposed around said inner conductor for sensing current flowing therein and generating an output signal having a magnitude proportional to the magnitude of a current supplied to said coaxial current divider.

25. A coaxial current divider in accordance with claim 23, wherein said intermediate and said inner conductors are each comprised of materials having temperatures coefficient of resistance less than that of copper.

26. The coaxial current divider in accordance with claim 25, wherein the resistance of said intermediate conductor is less than the resistance of said inner conductor.

27. The coaxial current divider in accordance with claim 26, wherein said intermediate conductor has a larger cross-section than the cross-section of said inner conductor.

28. A coaxial current divider in accordance with claim 23, wherein current components flowing in said outer, intermediate and inner conductors generate corresponding magnetic fields therearound, which interact to substantially cancel one another out and thereby reduce the magnitude of any magnetic field external to the outer surface of said outer conductor substantially to zero.

29. The coaxial current divider in accordance with claim 23, further including output means coaxially disposed about said inner conductor and inductively coupled thereto, for sensing a current component flowing in said inner conductor and generating an output signal having a magnitude proportional to the magnitude of a current supplied to said coaxial current divider.

30. A current sensor, comprising:
   (a) a conductive current divider adapted for series connection to a current component to be sensed, said current divider including,
      (i) a first, cup-shaped, member having a first terminal adjacent the bottom end thereof for making a first series connection,
      (ii) a shunt resistor, having an aperture extending therethrough between opposite ends thereof, disposed within said first member with one end of said shunt resistor extending beyond the open end of said first member, and the other end of said shunt resistor bonded to the bottom of said first member;
      (iii) a second, cup shaped member bonded to that end of said shunt resistor extending beyond the open end of said first member, forming a second terminal for making a second series connection,
      (iv) an, elongated, current measuring resistor disposed within said first and second members and being bonded at opposite ends thereof to corresponding bottom ends of said first and second members, whereby an input current applied to the first terminal of said first member is divided into first and second current components with said first current component flowing through said shunt resistor, and the second current component flowing through said current measuring resistor and said second member, and having a magnitude which is a scaled representation of the input current, the first and second current components being combined at the second terminal formed by the bonding of said shunt resistor and said second member; and
   (b) a current comparator, including a magnetic core mounted inside said second member and being inductively coupled to at least a portion of said current carrying element such that said current measuring resistor forms a primary winding of said current comparator, said current comparator further including first and second secondary windings wound on said magnetic core;
   (c) amplifier means responsive to an output signal from said first secondary winding and further including an output connected to said second secondary winding for providing a control current thereto for producing a compensating flux in said magnetic core substantially opposing flux induced into said magnetic core by the second current component flowing through said current measuring resistor; and
   (d) means connected to an output of said second secondary winding, and responsive to the current flowing therethrough, for producing an analog output signal representative of the current component to be sensed.

31. The current sensor in accordance with claim 30, further including, a surface at the bottom of said first member for drilling at least one hole through the bottom of said member and into either one of said shunt resistor and said current measuring resistor, after assembly of said current sensor, to thereby remove material from either of said shunt resistor and said current measuring resistor to selectively modify the resistances thereof, whereby said scaled representation of the input current is adjusted to a predetermined value.

32. Apparatus for dividing current applied thereto, comprising:
   (a) an, electrically conductive, cylindrical housing, having an open end and a closed end, and including means for connecting an input current to said apparatus;
   (b) a first resistor, having an aperture extending therethrough between first and second ends thereof, said first resistor being disposed inside said cylindrical housing with the first end thereof connected to the closed end of said housing;
   (c) a second resistor, having first and second ends, disposed inside the aperture of said first resistor, with the first end thereof attached to the closed end of said housing, whereby the input current supplied to said housing is divided into first and second current components flowing in said first and second resistors respectively, and (d) means enclosing the second end of said first resistor and being bonded thereto and to the second end of said second resistor to thereby provide a connection, whereby the first and second current components are combined to form an exit terminal for carrying current equal to an input current supplied to said apparatus.

33. The apparatus in accordance with claim 32, further including means disposed within said housing, and communicatively coupled to said second resistor, for sensing the second current component flowing therein, and providing an output signal having a magnitude proportional to the magnitude of the input current supplied to said apparatus.

34. A method of constructing a current sensor of the type adapted to provide an output signal therefrom having a magnitude proportional to the magnitude of a current, $I_{in}$, supplied to said current sensor, comprising the steps of:

(a) disposing a first conductor coaxially around a second conductor;

(b) disposing said first and second conductors coaxially within a third conductor;

(c) interconnecting said first and second conductors at corresponding first ends thereof, whereby the current, $I_{in}$, when supplied to said current sensor, is divided therein into two current components, I1 and I2, flowing through said first and second conductors respectively;

(d) connecting a second end of said first and second conductors to said third conductor, whereby the current components I1 and I2 are combined in said third conductor and flow therethrough in a direction opposite to the direction of the current components I1 and I2 flowing in said first and second conductors respectively, said first, second and third conductors generating corresponding magnetic fields, in response to the passage of current therethrough, which interact to cancel one another to thus prevent the generation of any magentic field external to said current sensor; and (e) providing means for sensing the current component, I2, flowing through said second conductor to generate an output signal having a magnitude proportional to the magnitude of the current, $I_{in}$, supplied to said current sensor.

35. A method of constructing a current sensor of the type adapted to provide an output signal therefrom having a magnitude proportional to the magnitude of a current, $I_{in}$, supplied to said current sensor, comprising the steps of:

(a) disposing a first conductor having a resistance, R1, coaxially around a second conductor having a resistance, R2;

(b) disposing said first and second conductors coaxially within a third conductor;

(c) interconnecting said first and second conductors at corresponding first ends thereof, whereby the current, $I_{in}$, when supplied to said current sensor, is divided into two current components, I1 and I2, flowing through said first and second conductors respectively;

(d) connecting a second end of said first and second conductors to said third conductor, whereby the current components I1 and I2 are combined in said third conductor and flow therethrough in a direction opposite to the direction of the current components I1 and I2 flowing in said first and second conductors respectively, said first, second and third conductors generating corresponding magnetic fields, in response to the passage of current therethrough, which interact to cancel one another to thus prevent the generation of any magnetic field external to said current sensor;

(e) providing means for sensing the current component, I2, flowing through said first conductor to generate an output signal having a magnitude proportional to the magnitude of the current, $I_{in}$, supplied to said current sensor; and (f) modifying the respective resistances, R1, R2, of either of said first and second conductors to make the magnitude of the output signal from said current sensor accurately proportional to the magnitude of the current, $I_{in}$.

36. The method in accordance with claim 35, wherein the respective resistances, R1, R2, of either of said first and second conductors are modified by removing material therefrom.

37. A method of constructing a current sensor and providing an output signal, Iout, therefrom having a magnitude proportional to the magnitude of the current, $I_{in}$, supplied to said current sensor, comprising the steps of:

(a) disposing a first conductor having a resistance, R1, coaxially within a second conductor having a resistance, R2;

(b) interconnecting said first and second conductors in a prescribed arrangement, whereby the current, $I_{in}$, when supplied to said current sensor, divides into two current components, I1 and I2, in said first and second conductors respectively, wherein I1+I2=$I_{in}$, and whereby the current component, I1, flowing in said first conductor provides a first stage of scaling of the current, $I_{in}$, as specified by the ratio of R1 and R2 and as given by:

$$I1 = \frac{I_{in}}{K}$$

$$\text{where } K = \left[ \frac{R1}{R2} + 1 \right];$$

(c) providing a current comparator having a toroidal magnetic core which has wound thereon a secondary sense winding and a secondary compensating winding of N-turns;

(d) disposing said first conductor, coaxially, within the toroidal core of said current comparator to provide a primary winding therefore;

(e) sensing, in the sense winding of said comparator, the magnitude of the current, I1, flowing in said first conductor; and (f) in response to the sensing, providing a current compensating signal to the N-turn compensating winding of said current comparator to perform a second stage of scaling of the current, $I_{in}$, whereby the magnetizing ampere turns resulting from the current, I1, flowing in said first conductor are made equal to the magnetizing ampere turns resulting from the current compensating signal flowing in the N-turn compensating winding to effect an overall scaling of the current, $I_{in}$, and generate an output signal, Iout, from the current compensating winding which has a magnitude equal to the product of two independent scale factors determined by the ratio of R1 and R2 and the number of turns, N, of the current compensating winding as given by:

$$Iout = \frac{I_{in}}{K \times N}.$$

38. The method in accordance with claim 37, further including the step of physically altering the resistances, R1, R2, of either of said first and second conductors respectively to thereby calibrate said current sensor, whereby the magnitude of the output signal, Iout, is made accurately proportional to the magnitude of the current, $I_{in}$, in a desired ratio defined by R1 and R2.

39. The method in accordance with claim 38, wherein the step of physically altering the resistances, R1, R2, includes the step of removing material from either of said first and second conductors.

40. The method in accordance with claim 39, wherein the step of removing material includes the step of drilling a hole in either of said first and second conductors.

41. In a current sensor, a method of sensing current, comprising the steps of:
(a) applying a current, $I_{in}$, to a first terminal of said current sensor, said first terminal generating a magnetic field therearound in response to the flow of the current, $I_{in}$, therethrough;
(b) dividing the current, $I_{in}$, at said first terminal into two current components, I1 and I2, flowing in first, second and third conductors arranged in a prescribed coaxial relationship and interconnected whereby I1 flows in said first conductor and I2 flows in opposite directions through said second and third conductors, said first, second and third conductors generating corresponding magnetic fields, in response to the passage of current therethrough, which inductively interact to cancel one another and thus prevent the generation of any magnetic field external to said current sensor;
(c) combining the current components, I1 and I2, at a second terminal formed by conjoining said first conductor with a selected one of said second and third conductors to derive a current, I1+I2=$I_{in}$, flowing in a direction through said second terminal opposite the direction of the current, $I_{in}$, flowing through said first terminal, said second terminal generating a magnetic field therearound in response to the flow of the current, I1+I2=$I_{in}$, therethrough;
(d) providing an inductive interaction of the magnetic fields surrounding said first and second terminals whereby the magnetic fields interact to cancel one another and to further cancel incident magnetic fields from sources external to said current sensor to thus render said current sensor substantially immune from the effects of such incident magnetic fields; and
(e) sensing one of the current components, I1, I2, flowing through a selected one of said first, second and third conductors to generate an output signal from said current sensor which is proportional to the magnitude of the current, $I_{in}$, applied to said current sensor.

42. A coaxial current sensor for providing an output signal proportional to current supplied thereto, comprising:
(a) a coaxial current divider for dividing current supplied thereto, including,
(i) a first conductor, having an aperture extending therethrough between opposite ends thereof, possessing a resistance of a value R1,
(ii) a second conductor coaxially disposed in the aperture of said first conductor, said second conductor being connected at opposite ends thereof to corresponding opposite ends of said first conductor, and possessing a resistance of a value R2, whereby an input current, $I_{in}$, supplied to one end of said first and second conductors, divides into currents $I_1$ and $I_2$ flowing in said first and second conductors respectively, and wherein the current $I_2$ flowing in said second conductor is given by:

$$I_2 = \frac{I_{in}}{K}$$

$$\text{where } K = \left[\frac{R2}{R1} + 1\right];$$

(b) output means coaxially disposed about said second conductor and inductively coupled thereto, for sensing the current $I_2$ flowing in said second conductor and providing an output signal having a magnitude proportional to the magnitude of the current $I_{in}$ supplied to said current sensor; and
(c) first and second conductive members substantially enclosing said first and second conductors and said output means, said first and second conductors each being connected at opposite ends thereof to a corresponding one of said first and second conductive members, whereby the input current $I_{in}$, when supplied to one end of said first and second conductive members, divides into the currents $I_1$ $I_2$ flowing in said first and second conductors to thereby be combined, in the other one of said first and second conductive members, as $I_{1+I2}$ equal to $I_{in}$.

43. The coaxial current sensor in accordance with claim 42, wherein said first and second conductors are comprised of materials having temperatures coefficient of resistance less than that of copper.

44. The coaxial current sensor in accordance with claim 43, wherein the resistance $R_1$ of said first conductor is less than the resistance $R_2$ of said second conductor.

45. The coaxial current sensor in accordance with claim 44, wherein said first conductor has a larger cross-section than the cross-section of said second conductor to thereby establish the values of $R_1$ and $R_2$ respectively.

46. The coaxial current sensor in accordance with claim 42, wherein said output means comprises a toroidal core transformer, having wound thereon first and second secondary windings, coaxially disposed around said second conductor, whereby said second conductor serves as a primary winding for said toroidal core transformer.

47. The coaxial current sensor in accordance with claim 46, wherein said toroidal core transformer is a current comparator, and further including an amplifier, having a small offset voltage, and having an input connected to said first secondary winding for sensing magnetic flux in the toroidal core and an output connected to said second secondary winding for providing a compensating signal to said second secondary winding to maintain the flux in the toroidal core at substantially zero, and switching means connected between said amplifier and each of said first and second secondary windings, whereby the small offset voltage is converted to an A.C. signal, coupled through said first and second secondary windings, and rectified to compensate for the offset voltage at the input to said amplifier.

48. The coaxial current sensor in accordance with claim 47, wherein said second secondary winding includes an output terminal for providing the output signal from said output means to a load.

* * * * *